(12) United States Patent
Miller et al.

(10) Patent No.: US 7,590,163 B1
(45) Date of Patent: Sep. 15, 2009

(54) SPREAD SPECTRUM CLOCK GENERATION

(75) Inventors: Mark Miller, Mission Viejo, CA (US); Chilan T. Nguyen, Tustin, CA (US)

(73) Assignee: Conexant Systems, Inc., Newport Beach, CA (US)

(*) Notice: Subject to any disclaimer, the term of this patent is extended or adjusted under 35 U.S.C. 154(b) by 585 days.

(21) Appl. No.: 11/437,311

(22) Filed: May 19, 2006

(51) Int. Cl.
*H04B 1/69* (2006.01)
*H03L 7/08* (2006.01)

(52) U.S. Cl. ...................... 375/130; 375/376

(58) Field of Classification Search ................ 375/130, 375/139, 145, 149, 260, 327, 367, 371, 373, 375/376; 370/515, 516; 708/250–252, 255
See application file for complete search history.

(56) References Cited

U.S. PATENT DOCUMENTS

| | | |
|---|---|---|
| 5,488,627 A | 1/1996 | Hardin et al. |
| 5,631,920 A | 5/1997 | Hardin |
| 5,867,524 A | 2/1999 | Booth et al. |
| 5,872,807 A | 2/1999 | Booth et al. |
| 6,167,103 A | 12/2000 | Hardin |
| 6,292,507 B1 | 9/2001 | Hardin et al. |
| 6,366,174 B1 | 4/2002 | Berry et al. |
| 6,377,646 B1 * | 4/2002 | Sha .............................. 375/376 |
| 6,404,834 B1 * | 6/2002 | Hardin et al. ............... 375/376 |
| 7,443,905 B1 * | 10/2008 | Llewellyn et al. ........... 375/130 |

* cited by examiner

*Primary Examiner*—Young T. Tse
(74) *Attorney, Agent, or Firm*—Farjami & Farjami LLP

(57) ABSTRACT

There is provided a method of modifying a first clock to generate a second clock with reduced electromagnetic interference (EMI). The method comprises receiving the first clock, generating an upslew modulation form during an upslew frequency transition, generating a downslew modulation form during a downslew frequency transition, modulating a frequency of the first clock over a period of time using the upslew modulation form and the downslew modulation form to generate the second clock, and wherein the upslew modulation form and the downslew modulation form are different. The upslew modulation form and the downslew modulation form are defined by upslew modulation values and downslew modulation values, respectively, and the method further comprises receiving the upslew modulation values and the downslew modulation values, and generating fractional upslew modulation values and fractional downslew modulation, respectively, for modulating the frequency of the first clock.

22 Claims, 4 Drawing Sheets

SPREAD SPECTRUM CLOCK GENERATION

BACKGROUND OF THE INVENTION

1. Field of the Invention

The present invention relates generally to methods and systems for reducing electromagnetic interference (EMI) in electronic circuits. More particularly, the present invention relates to methods and systems for generating spread spectrum clocks to reduce EMI in electronic circuits.

2. Background Art

EMI is a radiated or conducted energy that adversely affects circuit performance. Many types of electronic circuits radiate or are susceptible to EMI and must be shielded to ensure proper performance. Establishing basic electromagnetic compatibility in any electronic device generally requires two distinct approaches. The first approach is to reduce EMI generated from internal sources. This may be best accomplished by designing an electronic circuit or device so that it inherently generates less EMI. Residual EMI may then be suppressed or contained within the enclosure by appropriate filtering and shielding methods. Filtering cables at the point where they enter or leave the enclosure will reduce conducted emissions. Radiated EMI may be eliminated or reduced by the use of shielded enclosures and shielding materials. The second method for establishing electromagnetic compatibility (EMC) in a device is to improve its immunity (or reduce its susceptibility) to interference from external EMI sources. Susceptibility to external EMI may be reduced or even eliminated by designing circuits and choosing components which are inherently less sensitive to interference. As in the case of internal sources, conducted EMI may be reduced with filtering devices on incoming and outgoing leads, and susceptibility to externally radiated EMI may be reduced with use of effective shielding.

Government regulations in the US and many other countries prohibit electronic products from emitting EMI that could interfere with radio and television receivers. European regulations also include EMI immunity levels. Manufacturers of commercial electronic products generally contend with three types of EMI problems. The first problem is suppression of internally generated signals to prevent excessive levels of radiated and/or conducted emissions. The FCC in the United States, CSA in Canada, VCCI in Japan, AUSTEL in Australia, and legislation by EU (European Union) member countries all set certain standards for EMI emission levels that commercial electronic devices must meet before being sold in those countries. Many electronic products sold in the US must be tested and verified or certified for compliance with the FCC's Part 15 regulations. The second problem is the external ambient interference with equipment operation, where many companies establish their own specifications for immunity to EMI over a range of phenomena. These may include electrostatic discharge (ESD), radiated immunity, and electricfast transients (EFT). This is not yet a requirement in the US; however, EU regulations currently do include immunity requirements. The third problem is the internally generated emissions interfering with equipment operation, where EMI from one circuit can interfere with the function of another within the same system or subsystem. This is typically called cross-talk, and is the most common source of system susceptibility.

It is well known that EMI increases as a result of higher clock speeds. This radiation, which is mainly produced by fundamental and low-order harmonics, unfortunately coincides and interferes with radio FM bands. This is why regulatory agencies have placed limits on electromagnetic radiation produced by any electronic instrument that might use clocks and generate emissions. Almost any electrical transitions with sharp edges, such as clocks, data, address and control, produce electromagnetic radiation. As performance requirements increase, clock speeds have also increased. The transition edge, or in engineering terms, the slew rate, has become faster and faster as the need for meeting "set up" and "hold time" has become harder to meet, where "set up" is the time needed for a data pulse to be stable before the rising edge of the clock, and "hold time" is the time for the data pulse to remain stable after the edge of the clock.

Today, clocks are no longer fed to only one or two devices on circuit boards. Rather, clocks are being distributed all over the circuit board. Further, there has been an increase in memory requirements, and other loads on the clock lines. Since EMI is linearly proportional to current, the area of the current loop, and with the square of frequency, recent demand for higher speeds in electronic devices have significantly contributed to the difficulty of meeting the requirements for reducing electromagnetic radiation in electronic devices.

One conventional scheme, which is disclosed in U.S. Pat. No. 5,488,627 (the "'627 patent"), describes a well-known phase locked loop (PLL) frequency synthesizer, with an added modulation section that includes a spread spectrum modulation generator, where the modulation is fed into a voltage controlled oscillator (VCO) to provide a desired modulation index. The modulation reduces the spectral magnitude of the EMI components at harmonics of the clock when compared to the spectrum of the same clock signal without modulation. As explained therein, although the spectral width of the spread spectrum clock signal at a harmonic is greater than the width of the non-modulated clock signal, the maximum amplitude for harmonic is reduced. In order to minimize the amplitude of the signal for all frequencies, the '627 patent teaches a symmetrical signal modulating profile in four equal quadrants, where the profiles are expressed as a percentage of frequency deviation versus a percentage of the period of the periodic wave, i.e. the first quadrant is between −25% to 0% of the period, the second quadrant is between 0% to 25% of the period, the third quadrant is between 25% to 50% of the period, and the fourth quadrant is between 50% to 75% of the period.

However, the modulating profiles in the '627 patent brings about a major drawback. As illustrated in FIG. 4, the modulating profiles in the '627 patent create some undesirable spectral anomalies, which are shown as valleys 411 and peaks 412 in FIG. 4. These spectral anomalies can adversely affect EMI reduction and the clock output signal.

Accordingly, there is a need in the art for improved and more efficient methods and systems to reduce EMI in electronic circuits.

SUMMARY OF THE INVENTION

The present invention is directed to methods and systems for reducing EMI in electronic circuits. In one aspect, there is provided a clock modulation system for modifying a clock input to generate a clock output with reduced electromagnetic interference (EMI). The clock modulation system comprises a phase detector configured to receive the clock input and generate a phase detector output; a filter configured to receive the phase detector output and generate a filter output; an oscillator configured to receive the filter output and generate an oscillator output; a feedback divider configured to receive the oscillator output and generate divided output using a divide ratio; and a spread spectrum modulation profile generator configured to control the divide ratio for modulating a frequency of the clock input over a period of time using an upslew modulation form and a downslew modulation form to generate the clock output; wherein the spread spectrum modulation profile generator generates the upslew modulation form during an upslew frequency transition and generates a downslew modulation form during a downslew frequency transition, and wherein the upslew modulation form and the downslew modulation form are different.

In an additional aspect, the upslew modulation form and the downslew modulation form are defined by upslew modulation values and downslew modulation values, respectively, generated by the spread spectrum modulation profile generator, and the clock modulation system further comprises a fractional modulator configured to receive upslew modulation values and downslew modulation values and generate fractional upslew modulation values and fractional downslew modulation values, respectively, for modulating the frequency of the clock input.

In a further aspect, the upslew frequency transition occurs during a first period of the period of time and the downslew frequency transition occurs during a second period of the period of time, and wherein the second period is longer than the first period. In another aspect, the first segment is defined by low to high frequency deviation and the second segment is defined by high to low frequency deviation.

In one aspect, the upslew modulation form includes a first segment and a second segment, and wherein the first segment is symmetrical to the second segment, where the first segment occurs during a first period of the period of time and the second segment occurs during a second period of the period of time, and wherein the second period is the same as the first period, and where the first segment is defined by low to 0% frequency deviation and the second segment is defined by 0% to high frequency deviation.

In another aspect, the upslew modulation form includes a first segment and a second segment, and wherein the first segment has a different modulation form than the second segment. In an additional aspect, the upslew modulation form includes a first segment and a second segment, and wherein the first segment is different from the second segment.

Yet, in a further aspect, the downslew modulation form includes a first segment and a second segment, and wherein the first segment is symmetrical to the second segment, where the first segment occurs during a first period of the period of time and the second segment occurs during a second period of the period of time, and wherein the second period is the same as the first period, and where the first segment is defined by high to 0% frequency deviation and the second segment is defined by 0% to low frequency deviation.

In a separate aspect, there is also provided a method of modifying a first clock to generate a second clock with reduced electromagnetic interference (EMI). The method comprises receiving the first clock; generating an upslew modulation form during an upslew frequency transition; generating a downslew modulation form during a downslew frequency transition; modulating a frequency of the first clock over a period of time using the upslew modulation form and the downslew modulation form to generate the second clock; and wherein the upslew modulation form and the downslew modulation form are different.

In a further aspect, the upslew modulation form and the downslew modulation form are defined by upslew modulation values and downslew modulation values, respectively, and the method comprises receiving upslew modulation values and downslew modulation values, and generating fractional upslew modulation values and fractional downslew modulation, respectively, for modulating the frequency of the first clock.

In another aspect, the upslew frequency transition occurs during a first period of the period of time and the downslew frequency transition occurs during a second period of the period of time, and wherein the second period is longer than the first period, and in an additional aspect, the first segment is defined by low to high frequency deviation and the second segment is defined by high to low frequency deviation.

In a further aspect, the upslew modulation form includes a first segment and a second segment, and wherein the first segment is symmetrical to the second segment, where the first segment occurs during a first period of the period of time and the second segment occurs during a second period of the period of time, and wherein the second period is the same as the first period, and where the first segment is defined by low to 0% frequency deviation and the second segment is defined by 0% to high frequency deviation.

In yet another aspect, the upslew modulation form includes a first segment and a second segment, and wherein the first segment has a different modulation form than the second segment.

In an additional aspect, the downslew modulation form includes a first segment and a second segment, and wherein the first segment is symmetrical to the second segment, where the first segment occurs during a first period of the period of time and the second segment occurs during a second period of the period of time, and wherein the second period is the same as the first period, and where the first segment is defined by high to 0% frequency deviation and the second segment is defined by 0% to low frequency deviation. In another aspect, the downslew modulation form includes a first segment and a second segment, where the first segment is different from the second segment.

Other features and advantages of the present invention will become more readily apparent to those of ordinary skill in the art after reviewing the following detailed description and accompanying drawings.

BRIEF DESCRIPTION OF THE DRAWINGS

The features and advantages of the present invention will become more readily apparent to those ordinarily skilled in the art after reviewing the following detailed description and accompanying drawings, wherein.

DETAILED DESCRIPTION OF THE INVENTION

Figure 1:
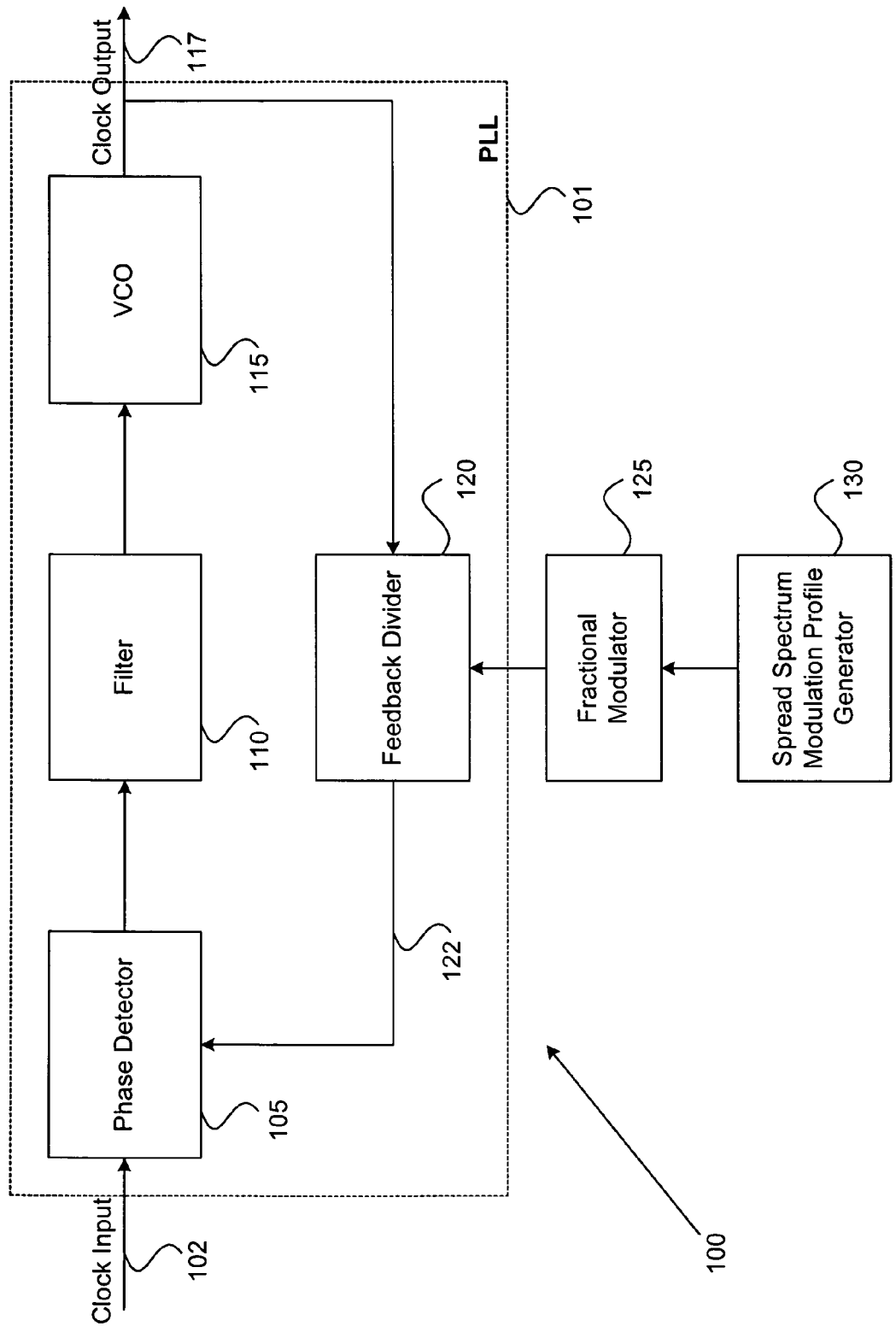
FIG. 1 is a block diagram illustrating a system for producing a spread spectrum modulated clock, according to one embodiment of the present invention.

Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings. It should be borne in mind that, unless noted otherwise, like or corresponding elements among the figures may be indicated by like or corresponding reference numerals.

FIG. 1 is a block diagram illustrating clock modulation system 100 for producing a spread spectrum modulated clock, according to one embodiment of the present invention. As shown, clock modulation system 100 includes PLL 101, spread spectrum modulation profile generator 130 and optional fractional modulator 125. PLL 101 includes a reference signal source (not shown) that generates clock input 102, phase detector 105, filter 110, VCO 115 and feedback divider 120. In operation, phase detector 105 acts to output either positive or negative pulses dependent upon whether the phase of clock input 102 leads or lags divided VCO signal 122. Filter 110 integrates the pulses from phase detector 105 to generate a tuning voltage for VCO 115. In turn, the tuning voltage forces the frequency of VCO 115 lip or down, such that the phases of clock input 102 and divided VCO signal 122 are synchronized. Signal frequency of VCO 115 may be changed by varying frequency of clock input 102 and/or the divide ratio of feedback divider 120. As discussed below, spread spectrum modulation profile generator 130 varies the divide ratio of feedback divider 120, which causes a frequency modulated signal to be generated at clock output 117. As an option, in one embodiment of the present invention, fractional modulator 125 may be utilized for fine frequency resolution for generating a fractional divide ratio to be used by feedback divider.

Figure 2:
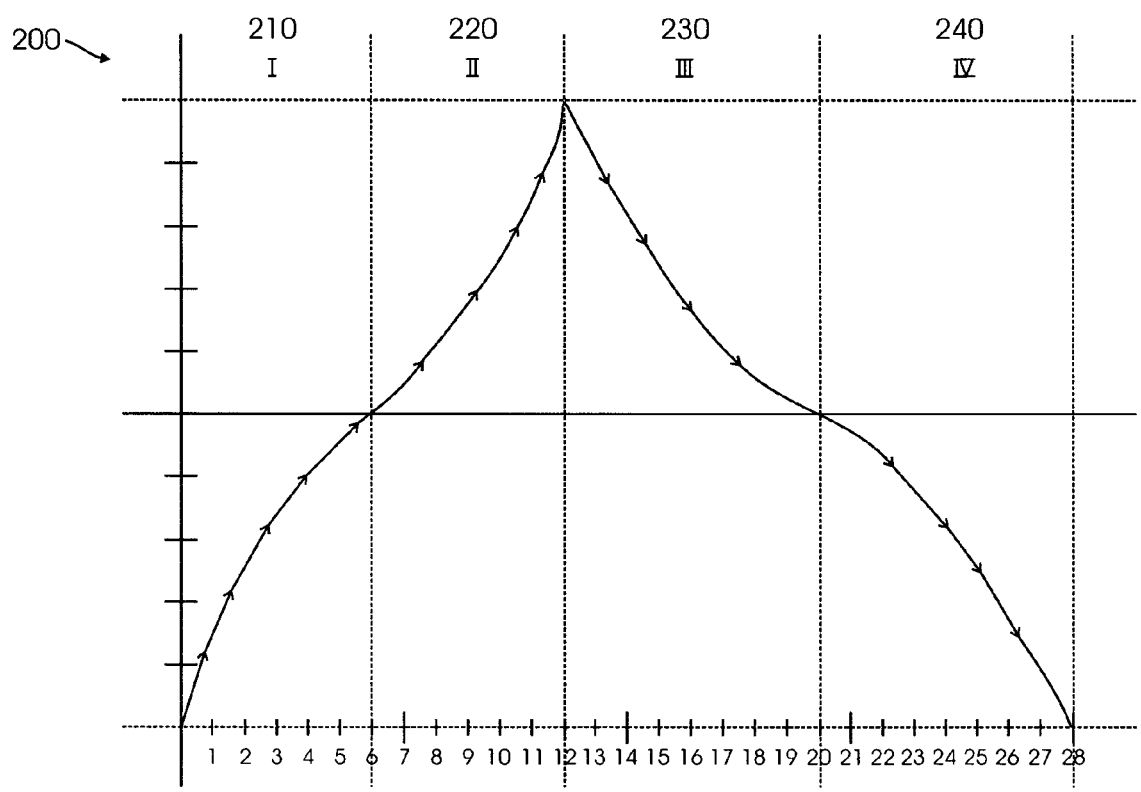
FIG. 2 is a first modulation profile graph illustrating an application of a first modulation profile by the system of FIG. 1 to produce the spread spectrum modulated clock, according to one embodiment of the present invention.

FIG. 2 is modulation profile graph 200 illustrating application of a modulation profile by the system of FIG. 1 to produce the spread spectrum modulated clock, according to one embodiment of the present invention. FIG. 2 illustrates frequency deviation produced by the modulation profile versus time. As shown, upslew frequency transition (low to high frequency over 0-12, i.e. low to high frequency deviation), defined by segment I 210 and segment II 220, is asymmetrical to (or different from) downslew frequency transition (high to low frequency over 12-28, i.e. high to low frequency deviation), defined by segment III 230 and segment IV 240. In other words, spread spectrum modulation profile generator 130 generates an upslew modulation form during the upslew frequency transition, where the upslew modulation form is asymmetrical to (or different from) a downslew modulation form that spread spectrum modulation profile generator 130 generates during the downslew frequency transition for modulating a frequency of the clock input 102 over a period of time.

The upslew modulation form and the downslew modulation form are defined by upslew modulation values and downslew modulation values, respectively, that are generated by spread spectrum modulation profile generator 130. In one embodiment, clock modulation system 100 may also include fractional modulator 125, which is configured to receive the upslew modulation values and the downslew modulation values and generate fractional upslew modulation values and fractional downslew modulation values, respectively. In one embodiment, spread spectrum modulation profile generator 130 may generate modulation values on the fly using a state machine to generate the parameters for use by feedback divider 120.

FIG. 2 illustrates a shift from the center of the total period between upslew frequency transition and downslew frequency transition, where the center of period is designated by 14, and where upslew to downslew transition occurs at time 12. However, as seen from FIG. 2, there is a symmetry between segment I 210 (0-6=6/28 of total period, i.e. low to 0% frequency deviation) and segment II 220 (6-12=6/28 of total period, i.e. 0% to high frequency deviation), on one hand, and there is a symmetry between segment III 230 (12-20=8/28 of total period, i.e. high to 0% frequency deviation) and segment IV 240 (20-28=8/28 of total period, i.e. 0% to low frequency deviation), on the other hand. It is known to those of skilled in the art how as to how parameters can be generated to achieve symmetry in segments I and II, and segments III and IV. Further, although FIG. 2 illustrates a fast upslew is followed by a slow downslew, this is not a requirement of the present invention. For example, in some embodiments a slow upslew may be followed by a fast downslew.

Figure 3:
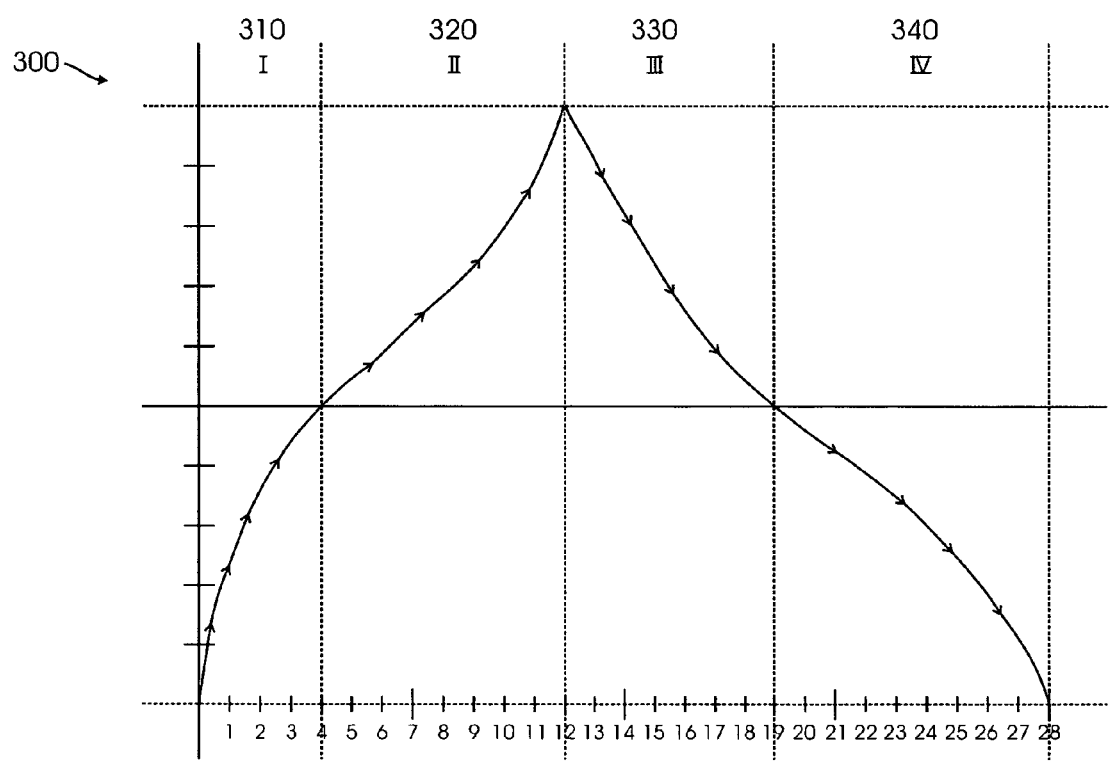
FIG. 3 is a second modulation profile graph illustrating an application of a second modulation profile by the system of FIG. 1 to produce the spread spectrum modulated clock, according to another embodiment of the present invention.

FIG. 3 is modulation profile graph illustrating application of another modulation profile for use by the system of FIG. 1 to produce the spread spectrum modulated clock, according to another embodiment of the present invention. FIG. 3 illustrates frequency deviation produced by the modulation profile versus time. As shown, upslew frequency transition (low to high over 0-12), defined by segment I 310 and segment II 320, is asymmetrical to (or different from) downslew frequency transition (high to low over 12-28), defined by segment III 330 and segment IV 340. Further, as seen from FIG. 3, there is also an asymmetry or a difference between segment I 310 (0-4=4/28 of total period) and segment II 320 (4-12=8/28 of total period), on one hand, and there is an asymmetry or a difference between segment III 330 (12-19=7/28 of total period) and segment IV 340 (19-28=9/28 of total period), on the other hand. For example, FIG. 3 illustrates a shift from the center of period for segments I and II that is designated by 6, where segment I 310 transitions to segment II 320 at time 4. It is known to those of skilled in the art how as to how parameters can be generated to achieve an asymmetrical or a different deviation in segments I and II, and segments III and IV.

Appendix A illustrates a Veilog code for a spread spectrum (ss) state machine for generating modulation values, according to one embodiment of the invention. With reference to the Verilog code, there are shown five states, namely, Idle, Down2, Up2, Down1 and Up1. In the Idle state, the spread spectrum state machine is disabled. Down2 state corresponds to segment I of FIG. 2 or FIG. 3, Up2 state corresponds to segment II of FIG. 2 or FIG. 3, Down1 state corresponds to segment III of FIG. 2 or FIG. 3, and Up1 state corresponds to segment IV of FIG. 2 or FIG. 3. Further, Appendix B illustrates a list of modulation values generated by a spread spectrum (ss) modulation state machine, of the type illustrated in Appendix A, according to one embodiment of the invention.

Figure 4:
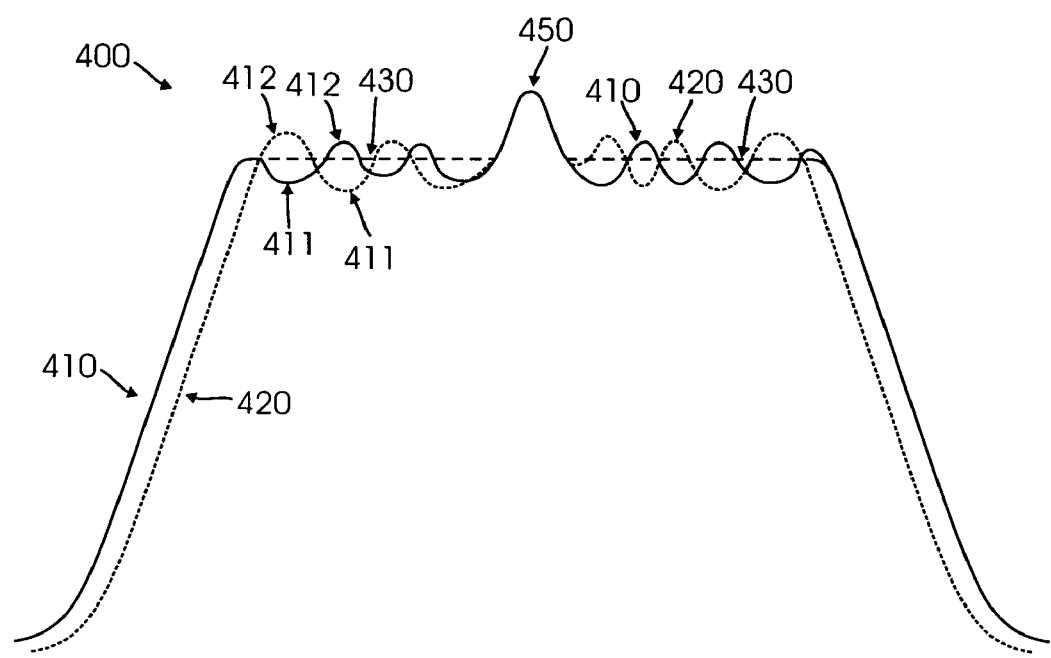
FIG. 4 is a graph illustrating a spectral representation of a clock signal produced by a spread spectrum modulation, according to one embodiment of the present invention.

FIG. 4 is a graph illustrating a spectral representation of a clock signal produced by clock modulation system 100 of FIG. 1. The spectral representation of FIG. 4 shows the advantages of the present invention, where for example, the asymmetry or difference between upslew frequency transition and downslew frequency transition produces two separate spectral forms, designated by 410 and 420 spectral profiles, that are slightly different, and some of their peaks 412 and valleys 411 cancel each other out and result in a smoother or flattened signal 430, although central peak 450 still remains at the center.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. For example, it is contemplated that the circuitry disclosed herein can be implemented in software, or vice versa. The described embodiments are to be considered in all respects as illustrative and not restrictive. It should also be understood that the invention is not limited to the particular embodiments described herein, but is capable of many rearrangements, modifications, and substitutions without departing from the scope of the invention.

What is claimed is:

1. A clock modulation system for modifying a clock input to generate a clock output with reduced electromagnetic interference (EMI), the clock modulation system comprising:
    a phase detector configured to receive the clock input and generate a phase detector output;
    a filter configured to receive the phase detector output and generate a filter output;
    an oscillator configured to receive the filter output and generate an oscillator output;
    a feedback divider configured to receive the oscillator output and generate a divided output using a divide ratio; and
    a spread spectrum modulation profile generator configured to control the divide ratio for modulating a frequency of the clock input over a period of time using an upslew modulation form and a downslew modulation form to generate the clock output;
    wherein the spread spectrum modulation profile generator generates the upslew modulation form during an upslew frequency transition and generates the downslew modulation form during a downslew frequency transition, wherein the upslew modulation form is asymmetrical to the downslew modulation form, wherein the upslew frequency transition occurs during a first time period of the period of time and the downslew frequency transition occurs during a second time period of the period of time, and wherein the second time period is longer than the first time period.

2. The clock modulation system of claim 1, wherein the upslew modulation form and the downslew modulation form are defined by upslew modulation values and downslew modulation values, respectively, generated by the spread spectrum modulation profile generator and wherein the clock modulation system further comprising:
    a fractional modulator configured to receive the upslew modulation values and the downslew modulation values and generate fractional upslew modulation values and fractional downslew modulation values, respectively, for modulating the frequency of the clock input.

3. The clock modulation system of claim 1, wherein the upslew modulation form includes a first segment and a second segment, and wherein the first segment is defined by low to high frequency deviation and the second segment is defined by high to low frequency deviation.

4. The clock modulation system of claim 1, wherein the upslew modulation form includes a first segment and a second segment, and wherein the upslew frequency transition of the first segment is equal to the upslew frequency transition of the second segment.

5. The clock modulation system of claim 4, wherein the first segment occurs during a first period of the first time period and the second segment occurs during a second period of the first time period, and wherein the second period is equal to the first period.

6. The clock modulation system of claim 4, wherein the first segment is defined by low to 0% frequency deviation and the second segment is defined by 0% to high frequency deviation.

7. The clock modulation system of claim 1, wherein the upslew modulation form includes a first segment and a second segment, and wherein the first segment has a different modulation form than the second segment.

8. The clock modulation system of claim 1, wherein the downslew modulation form includes a first segment and a second segment, and wherein the downslew frequency transition of the first segment is equal to the downslew frequency transition of the second segment.

9. The clock modulation system of claim 8, wherein the first segment occurs during a first period of the second time period and the second segment occurs during a second period of the second time period, and wherein the second period is equal to the first period.

10. The clock modulation system of claim 8, wherein the first segment is defined by high to 0% frequency deviation and the second segment is defined by 0% to low frequency deviation.

11. The clock modulation system of claim 1, wherein the downslew modulation form includes a first segment and a second segment, and wherein the first segment has a different modulation form than the second segment.

12. A method of modifying a first clock to generate a second clock with reduced electromagnetic interference (EMI), the method comprising:
    receiving the first clock;
    generating an upslew modulation form during an upslew frequency transition;
    generating a downslew modulation form during a downslew frequency transition; and
    modulating, by a fractional modulator, a frequency of the first clock over a period of time using the upslew modulation form and the downslew modulation form to generate the second clock;
    wherein the upslew modulation form is asymmetrical to the downslew modulation form, wherein the upslew frequency transition occurs during a first time period of the period of time and the downslew frequency transition occurs during a second time period of the period of time, and wherein the second time period is longer than the first time period.

13. The method of claim 12, wherein the upslew modulation form and the downslew modulation form are defined by upslew modulation values and downslew modulation values, respectively, and wherein the method further comprising:
    receiving the upslew modulation values and the downslew modulation values, and generating fractional upslew modulation values and fractional downslew modulation values, respectively, for modulating the frequency of the first clock.

14. The method of claim 12, wherein the upslew modulation form includes a first segment and a second segment, and wherein the first segment is defined by low to high frequency deviation and the second segment is defined by high to low frequency deviation.

15. The method of claim 12, wherein the upslew modulation form includes a first segment and a second segment, and wherein the upslew frequency transition of the first segment is equal to the upslew frequency transition of the second segment.

16. The method of claim 15, wherein the first segment occurs during a first period of the first time period and the second segment occurs during a second period of the first time period, and wherein the second period is equal to the first period.

17. The method of claim 15, wherein the first segment is defined by low to 0% frequency deviation and the second segment is defined by 00% to high frequency deviation.

18. The method of claim 12, wherein the upslew modulation form includes a first segment and a second segment, and wherein the first segment has a different modulation form than the second segment.

19. The method of claim 12, wherein the downslew modulation form includes a first segment and a second segment, and wherein the downslew frequency transition of the first segment is equal to the downslew frequency transition of the second segment.

20. The method of claim 19, wherein the first segment occurs during a first period of the second time period and the second segment occurs during a second period of the second time period, and wherein the second period is equal to the first period.

21. The method of claim 20, wherein the first segment is defined by high to 0% frequency deviation and the second segment is defined by 0% to low frequency deviation.

22. The method of claim 12, wherein the downslew modulation form includes a first segment and a second segment, and wherein the first segment has a different modulation form than the second segment.

* * * * *